(12) United States Patent  
Rudmann et al.

(10) Patent No.: US 8,606,057 B1  
(45) Date of Patent: Dec. 10, 2013

(54) OPTO-ELECTRONIC MODULES INCLUDING ELECTRICALLY CONDUCTIVE CONNECTIONS FOR INTEGRATION WITH AN ELECTRONIC DEVICE

(71) Applicant: Heptagon Micro Optics Pte. Ltd., Singapore (SG)

(72) Inventors: Hartmut Rudmann, Jona (CH); Mario Cesana, Au (CH); Jukka Alasirnio, Jaali (FI); Philippe Bouchilloux, Singapore (SG); Susanne Westenhoefer, Wettswil (CH); Jens Geiger, Thalwil (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 13/685,193

(22) Filed: Nov. 26, 2012

Related U.S. Application Data

(60) Provisional application No. 61/721,720, filed on Nov. 2, 2012.

(51) Int. Cl.  
*G02B 6/12* (2006.01)

(52) U.S. Cl.  
USPC .......................................................... 385/14

(58) Field of Classification Search  
None  
See application file for complete search history.

(56) References Cited

U.S. PATENT DOCUMENTS

| | | | | |
|---|---|---|---|---|
| 5,195,154 A | * | 3/1993 | Uchida | .......................... 385/88 |
| 7,663,083 B2 | | 2/2010 | Kwon et al. | |
| 8,193,555 B2 | * | 6/2012 | Lin et al. | .......................... 257/99 |
| 2005/0189622 A1 | * | 9/2005 | Humpston et al. | ............ 257/659 |
| 2005/0189635 A1 | * | 9/2005 | Humpston et al. | ............ 257/678 |
| 2006/0259546 A1 | | 11/2006 | Rudmann et al. | |
| 2007/0009223 A1 | | 1/2007 | Rudmann et al. | |
| 2007/0216046 A1 | | 9/2007 | Rudmann et al. | |
| 2007/0216047 A1 | | 9/2007 | Rudmann et al. | |
| 2007/0216048 A1 | | 9/2007 | Rudmann et al. | |
| 2007/0216049 A1 | | 9/2007 | Rudmann et al. | |
| 2008/0054506 A1 | | 3/2008 | Rudmann et al. | |
| 2008/0054507 A1 | | 3/2008 | Rudmann et al. | |
| 2008/0054508 A1 | | 3/2008 | Rudmann et al. | |
| 2008/0157250 A1 | * | 7/2008 | Yang et al. | ..................... 257/433 |
| 2008/0230934 A1 | | 9/2008 | Rudmann et al. | |
| 2009/0159200 A1 | | 6/2009 | Rossi et al. | |
| 2009/0212407 A1 | * | 8/2009 | Foster et al. | .................. 257/686 |
| 2010/0072640 A1 | | 3/2010 | Rudmann et al. | |
| 2010/0183760 A1 | | 7/2010 | Rudmann et al. | |
| 2010/0200898 A1 | * | 8/2010 | Lin et al. | ....................... 257/294 |
| 2011/0013292 A1 | | 1/2011 | Rossi et al. | |
| 2011/0024030 A1 | | 2/2011 | Rudmann et al. | |
| 2011/0031510 A1 | | 2/2011 | Rossi et al. | |

(Continued)

*Primary Examiner* — Sung Pak  
(74) *Attorney, Agent, or Firm* — Fish & Richardson P.C.

(57) ABSTRACT

Opto-electronic modules include conductive wiring and connections that can facilitate integrating the modules into an external device. Some opto-electronic modules include an opto-electronic stack that includes at least one lens and an opto-electronic element. Conductive paths can extend from the bottom to the top of the module. The conductive paths can include conductive pads on the surface of the opto-electronic element, as well as wiring at least partially embedded in a substrate and walls of a housing for the opto-electronic stack. Conductive connections can be disposed between a top surface of the substrate and the bottom surface of the walls such that the conductive connections electrically connect the second wiring to the first wiring and to the conductive pads on the surface of the opto-electronic element. The modules can be fabricated, for example, in wafer-level processes so that multiple opto-electronic modules can be manufactured at the same time.

30 Claims, 15 Drawing Sheets

(56) References Cited

U.S. PATENT DOCUMENTS

| | | |
|---|---|---|
| 2011/0032409 A1 | 2/2011 | Rossi et al. |
| 2011/0032712 A1 | 2/2011 | Dias et al. |
| 2011/0039048 A1 | 2/2011 | Rossi et al. |
| 2011/0043923 A1 | 2/2011 | Rossi et al. |
| 2011/0050979 A1 | 3/2011 | Rudmann |
| 2011/0156074 A1* | 6/2011 | Liu et al. ............ 257/98 |
| 2011/0193491 A1* | 8/2011 | Choutov et al. ............ 315/291 |
| 2011/0220278 A1 | 9/2011 | Rudmann et al. |

* cited by examiner

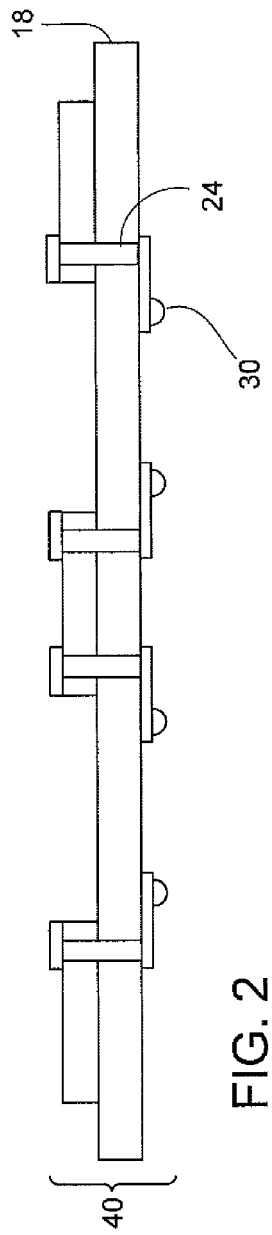
FIG. 2
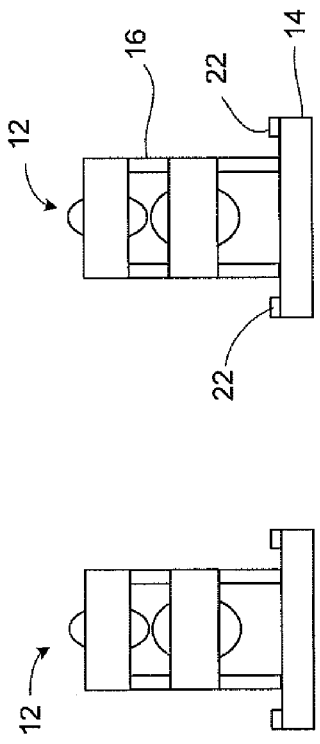
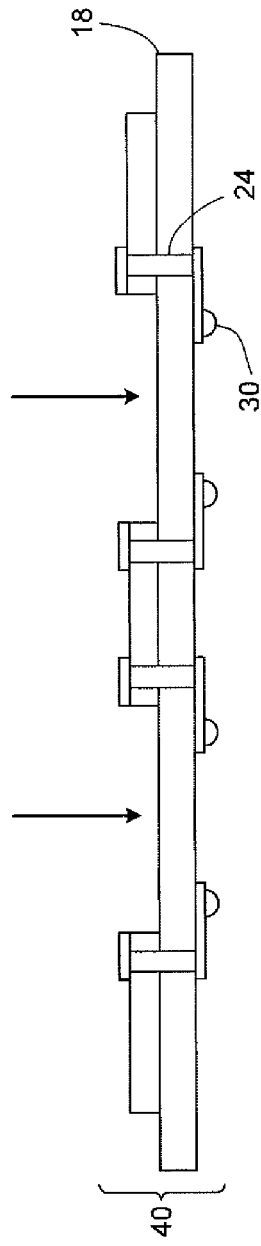
FIG. 3

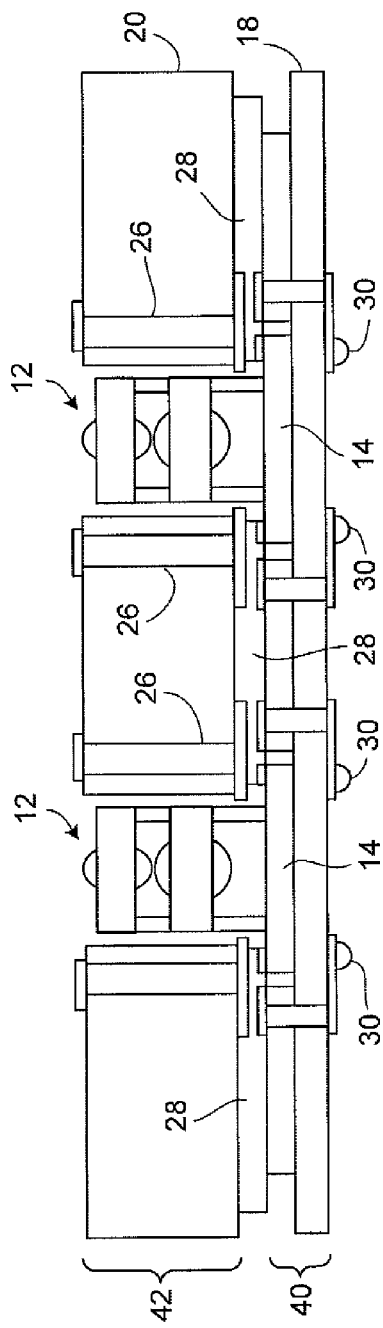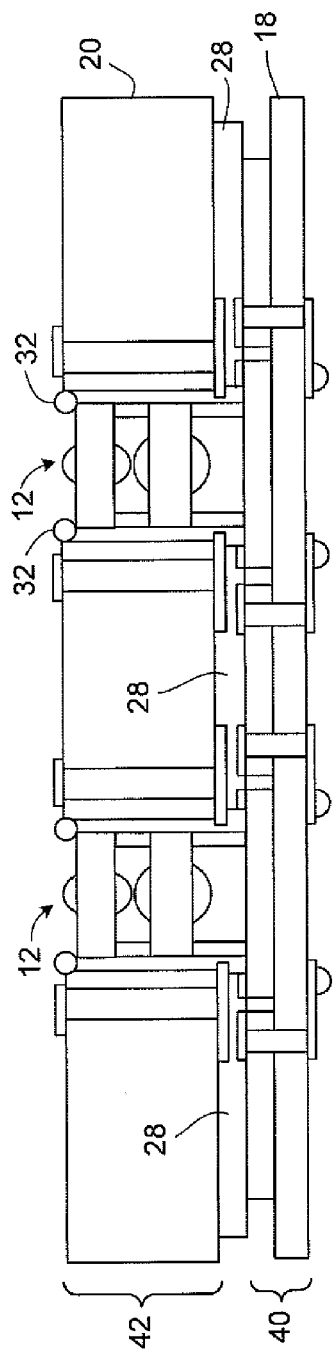

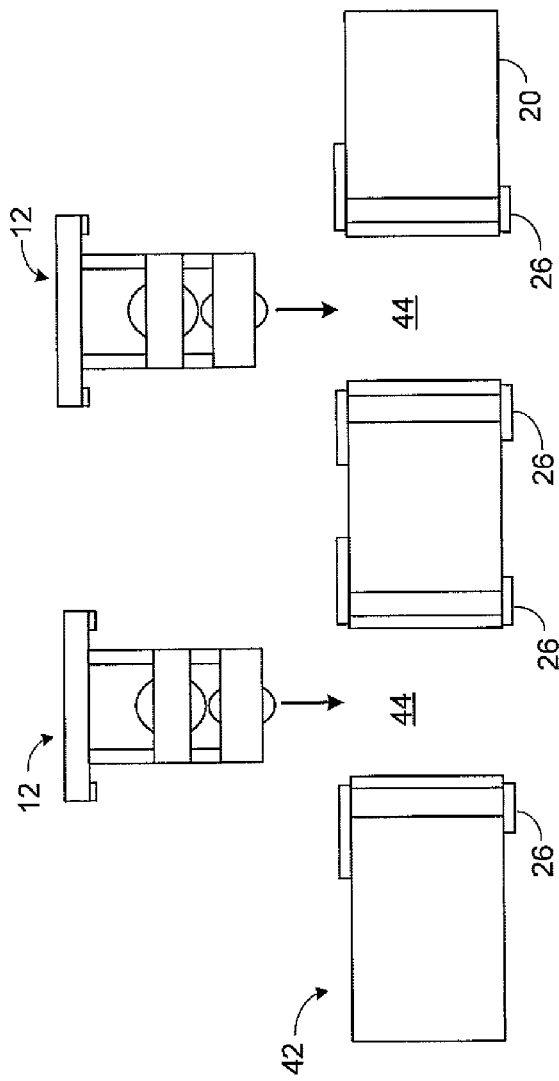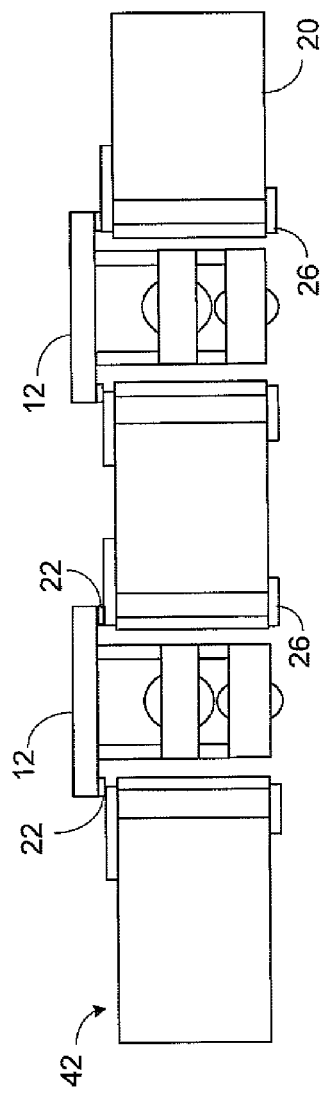

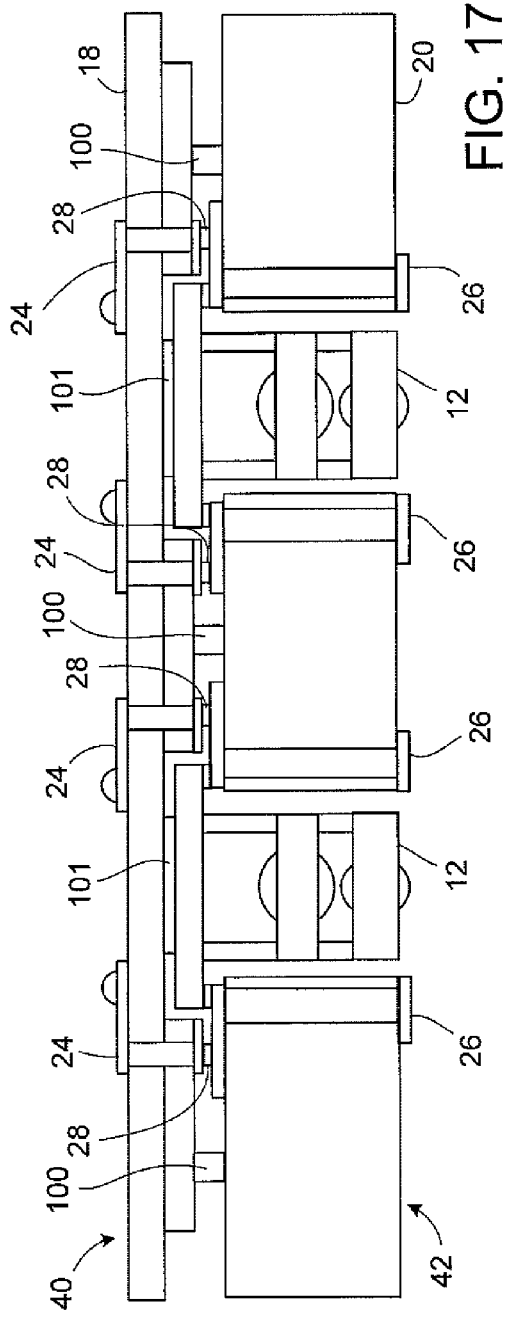
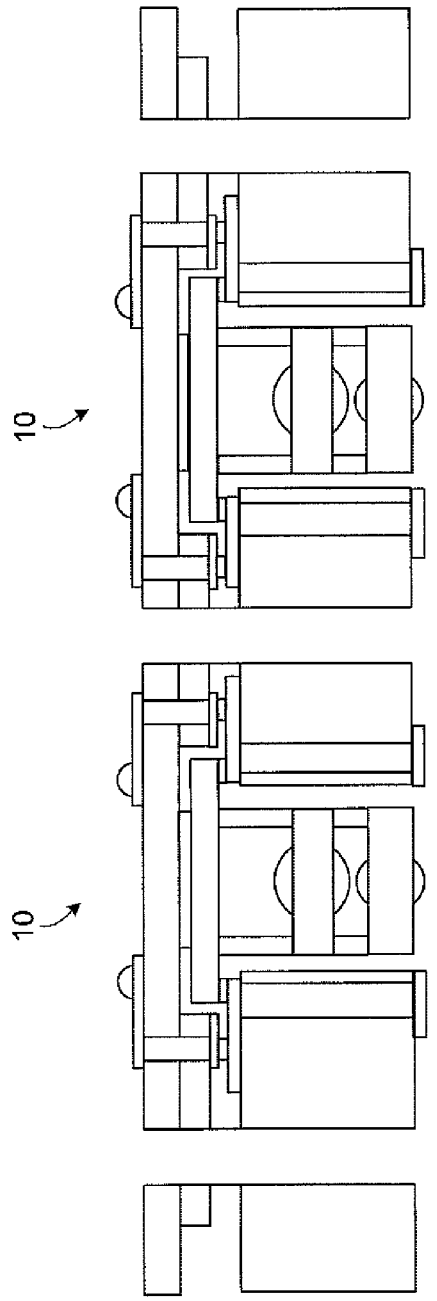

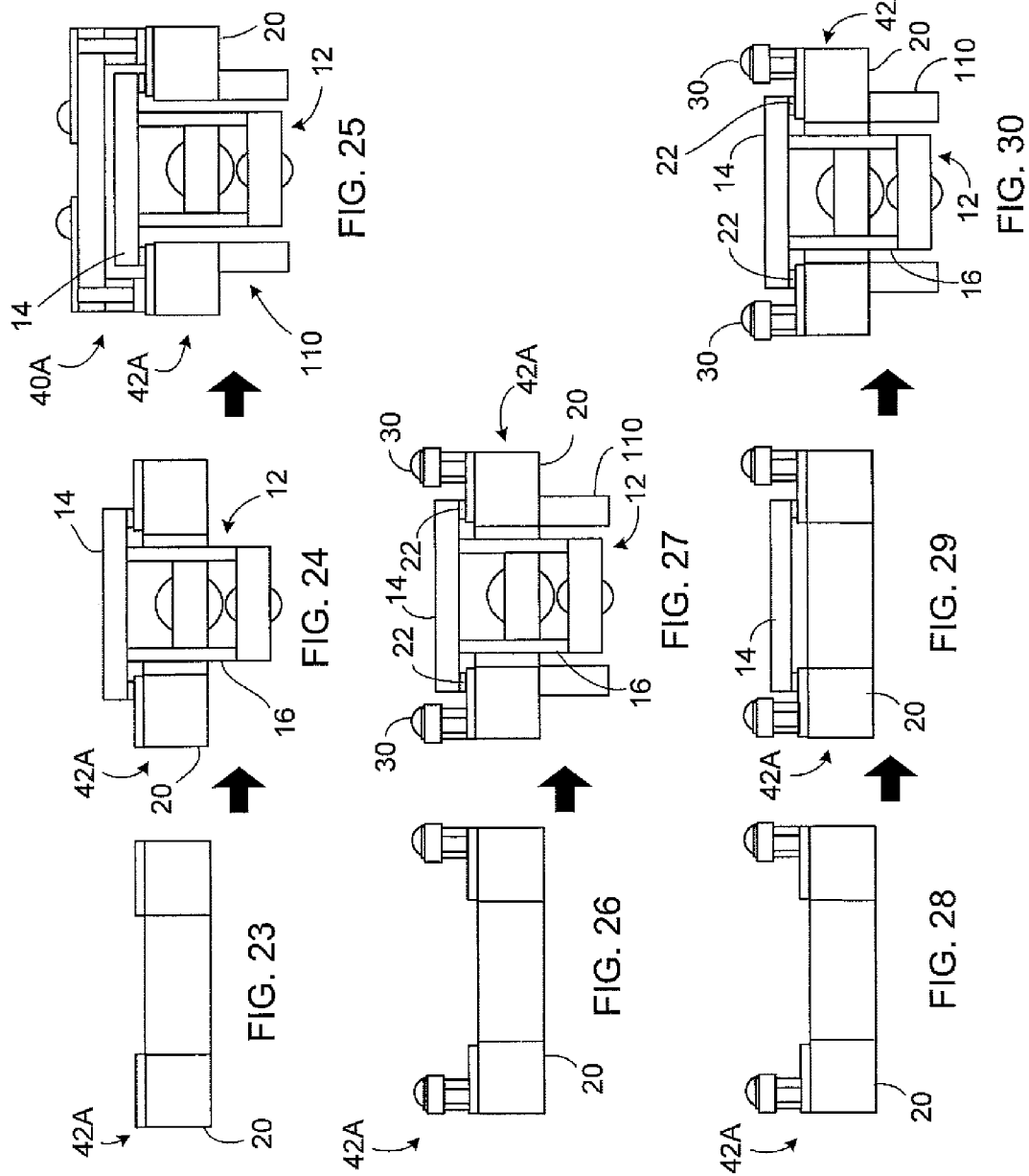

OPTO-ELECTRONIC MODULES INCLUDING ELECTRICALLY CONDUCTIVE CONNECTIONS FOR INTEGRATION WITH AN ELECTRONIC DEVICE

CROSS-REFERENCE TO RELATED APPLICATION(S)

This application claims the benefit of priority of U.S. Patent Application No. 61/721,720 filed on Nov. 2, 2012.

FIELD OF THE DISCLOSURE

The present disclosure relates to opto-electronic modules that include electrically conductive connections for integration with an electronic device. The disclosure also relates to wafer-level processes for fabricating the modules, and to devices that incorporate such modules.

BACKGROUND

Opto-electronic modules, such as camera optics, light modules and sensor modules, often are integrated into electronic devices such as mobile phones and other handheld or portable devices, as well as other appliances. It has become increasingly important for such modules to be manufactured economically, for example in a parallel process, and for the modules to have as few parts as possible that are mechanically complicated, difficult to manufacture or delicate to handle. Manufacturing processes can be complicated because the various optical and/or opto-electronic elements need to be integrated into the modules, which then need to be assembled into the electronic devices (e.g., mobile phones). In addition, to allow proper functioning of an opto-electronic module when it is integrated into a device such as a mobile phone, electrical connections need to be provided between the module and the device.

SUMMARY

This disclosure describes opto-electronic modules and fabrication methods. Various implementations of the modules include conductive wiring and connections that can facilitate integrating the modules into an external device. In some implementations, the conductive wiring and connections can facilitate integrating the module with other components.

For example, according to some implementations, opto-electronic modules include conductive wiring and connections that can facilitate integrating the modules into an external device. Some opto-electronic modules include an opto-electronic stack that includes at least one lens and an opto-electronic element. Conductive paths can extend from the bottom to the top of the module. The conductive paths can include conductive pads on the surface of the opto-electronic element, as well as wiring at least partially embedded in a substrate and walls of a housing for the opto-electronic stack. Conductive connections can be disposed between a top surface of the substrate and the bottom surface of the walls such that the conductive connections electrically connect the second wiring to the first wiring and to the conductive pads on the surface of the opto-electronic element. The modules can be integrated into a wide range of electronic devices.

The modules can be fabricated, for example, in wafer-level processes so that multiple opto-electronic modules can be manufactured at the same time. The fabrication techniques can be used in connection with packaging for a wide range of opto-electronic stacks. Furthermore, the opto-electronic stacks described in detail below can be used in combination with any of the fabrication techniques. Furthermore, other types of opto-electronic stacks that may differ in various details can be used in the foregoing fabrication techniques.

Other aspects, features and advantages will be readily apparent form the following detailed description, the accompanying drawings and the claims.

BRIEF DESCRIPTION OF THE DRAWINGS

FIGS. 2 through 7 illustrate a bottom-up fabrication process for making multiple opto-electronic modules.

FIGS. 14 through 18 illustrate a top-down fabrication process for making multiple opto-electronic modules.

FIGS. 23 through 25 illustrate a method of fabricating opto-electronic modules using a spacer.

FIGS. 26 and 27 illustrate a method of fabricating opto-electronic modules using a single printed circuit board and a spacer.

FIGS. 28 through 30 illustrate a further method of fabricating opto-electronic modules using a single printed circuit board and a spacer.

DETAILED DESCRIPTION

Figure 1:
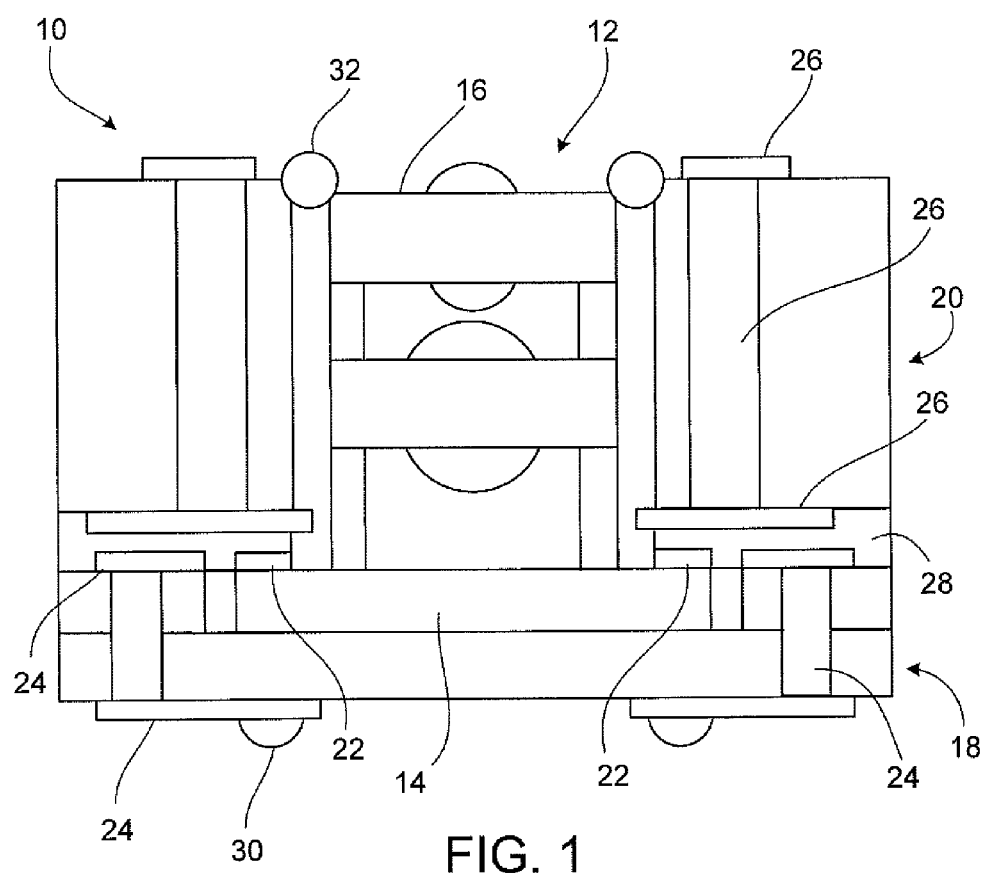
FIG. 1 illustrates an example of an opto-electronic module.

As shown in FIG. 1, an opto-electronic module 10 includes an opto-electronic stack 12 that, in turn, includes an opto-electronic element 14 and a lens stack 16. Lens stack 16 can include one or more optical elements and may include spacers separating the optical elements from one another. Thus, lens stack 16 can include, for example, a single lens or a lens array. In the illustrated implementation, module 10 can function, for example, as a camera, a flash or a sensor that can be integrated into and electrically connected to an electronic device (e.g., a mobile phone or other handheld or portable device) that is external to module 10. Examples of opto-electronic element 14 include an image sensor chip, a light emitter element (e.g., a LED, OLED or laser chip) or a detector element (e.g., a photodiode). As shown in FIG. 1, lens stack 16 is disposed above, and aligned with, opto-electronic element 14. Lens stack 16 can be attached directly, for example, to the top surface of opto-electronic element 14. Conductive pads 22 are located on the top surface of opto-electronic element 14, outside the area where lens stack 16 is positioned. For example, as illustrated in FIG. 1, conductive pads 22 are located near the edge of the top surface of opto-electronic element 14.

Opto-electronic stack 12 is housed within a housing or packaging composed of a housing substrate 18 and housing walls 20. Housing substrate 18 and walls 20 can be formed, for example, of a printed circuit board (PCB) material, such as fiberglass or ceramic. As illustrated in the example of FIG. 1, opto-electronic stack 12 is disposed on a top surface of housing substrate 18, which serves as the bottom of the housing, whereas housing walls 20 define sidewalls of the housing. An adhesive material can be provided between the upper surface of substrate housing 18 and the lower surface of opto-electronic element 14. An opening at the top of module 10 exposes the top of lens stack 16 to the outside for transmitting and/or emitting light. The space between the sides of opto-electronic stack 12 and the adjacent surface of housing walls 20 can be closed off by seals 32.

Housing substrate 18 includes wiring 24 that extends through the substrate from its top surface to its bottom surface. Likewise, housing walls 20 include wiring 26 that extends through the walls from the top surfaces to the bottom surface. Wiring 24, 26 can be formed, for example, using a plated through-hole (PTH) conductive via process. As illustrated in the example of FIG. 1, portions of wiring 24 are embedded within housing substrate 18, and portions of wiring 26 are embedded within housing walls 20. The wiring 24, 26 also can extend along the upper and lower surfaces of the housing substrate 18 and walls 20. Wiring 24 on the bottom surface of housing substrate 18 and wiring 26 on the top surface of housing walls 20 can serve as conductive terminal pads. Wiring 24, 26 can be provided, for example, by a plating process using a conductive metal or metal alloy such as copper (Cu), gold (Au), nickel (Ni), tin-silver (SnAg), silver (Ag) or nickel-palladium (NiPd). Other metals or metal alloys may be used in some implementations as well. In the example of FIG. 1, wiring 24, 26 is illustrated as vertical plated conductive vias that extend, respectively, from the top surface to the bottom surface of housing substrate 18 and walls 20. In some implementations, however, the plated conductive vias may extend horizontally out to exterior sidewalls of module 10.

In some implementations, it is also possible for the housing walls 20 to be composed, at least partially, of spacer material similar to the spacer material used in the lens stacks. This can be, for example, polymer material such as non-transparent epoxy or glass reinforced epoxy. In this case, wiring 24, 26 can be provided by printing or spraying conductive wiring onto the spacer, applying a conductive coating onto the spacer, embedding conductive wires, pins or plated through holes into the spacer, or using conductive epoxy material as a spacer.

Conductive connections 28 are provided between the upper surface of housing substrate 18 and the lower surface of walls 20. Conductive connections 28 can take any one of various forms including, for example, conductive elastomer strips, conductive epoxy or glue, conductive POCO™ pins, spring connectors, or an anisotropic conductive material such as an anisotropic conductive film, epoxy, paste or adhesive. Conductive connections 28 can be in direct contact with conductive pads 22 on the top surface of opto-electronic element 14, the upper portion of wiring 24 on housing substrate 18, and the lower portion of wiring 26 on walls 20. Conductive connections 28 thus serve several functions. First, they hold together housing 18 and walls 20 mechanically. Second, they provide conductive (i.e., electrical) paths between wiring 24 in housing substrate 18, wiring 26 in housing walls 20, and conductive pads 22 on the top surface of opto-electronic element 14. Thus, there in the illustrated example, there are conductive paths that extend through module 10 from its bottom surface to its top surface.

Solder balls 30 may be provided, in some implementations, as part of a ball grid array (BGA) on wiring 24 at the bottom surface of housing substrate 18. The ball grid array, if present, can facilitate surface-mounting of module 10 to a printed circuit board (PCB) so that module 10 can be integrated, for example, into an electronic device (e.g., a mobile phone). Thus, the combination of conductive pads 22, conductive connections 28 and wiring 24 enable signals from opto-electronic element 14 to be provided, for example, to an integrated circuit external to module 10 (e.g., a PCB within a mobile phone). In other implementations, electrical connection to the external integrated circuit can be made directly by the conductive wiring 24 on the bottom surface of housing substrate 18.

Opto-electronic modules like module 10 can be assembled as part of a wafer-level fabrication process. An example of such a process is illustrated by FIGS. 2 through 7, which illustrate how packaging of multiple modules 10 can be performed at the wafer level. As illustrated in FIG. 2, a first substrate panel (e.g., a printed circuit board) 40 is provided and includes wiring 24 and solder balls 30 for the ball grid array. As shown in FIG. 3, pre-assembled opto-electronic stacks 12 then are attached to an upper surface of first printed circuit board 40. Opto-electronic stacks 12 can be fabricated, for example, during a previous wafer-level process such that multiple opto-electronic stacks 12 are fabricated in parallel. As part of such a process, opto-electronic elements 14 can be attached directly to lens stacks 16, which can be made, for example, by replication, such as embossing, molding, imprinting, casting or etching. Likewise, conductive pads 22 can be provided on the top surfaces of opto-electronic elements as part of the previous wafer-level process for the pre-assembled opto-electronic stacks 12.

Figure 4:
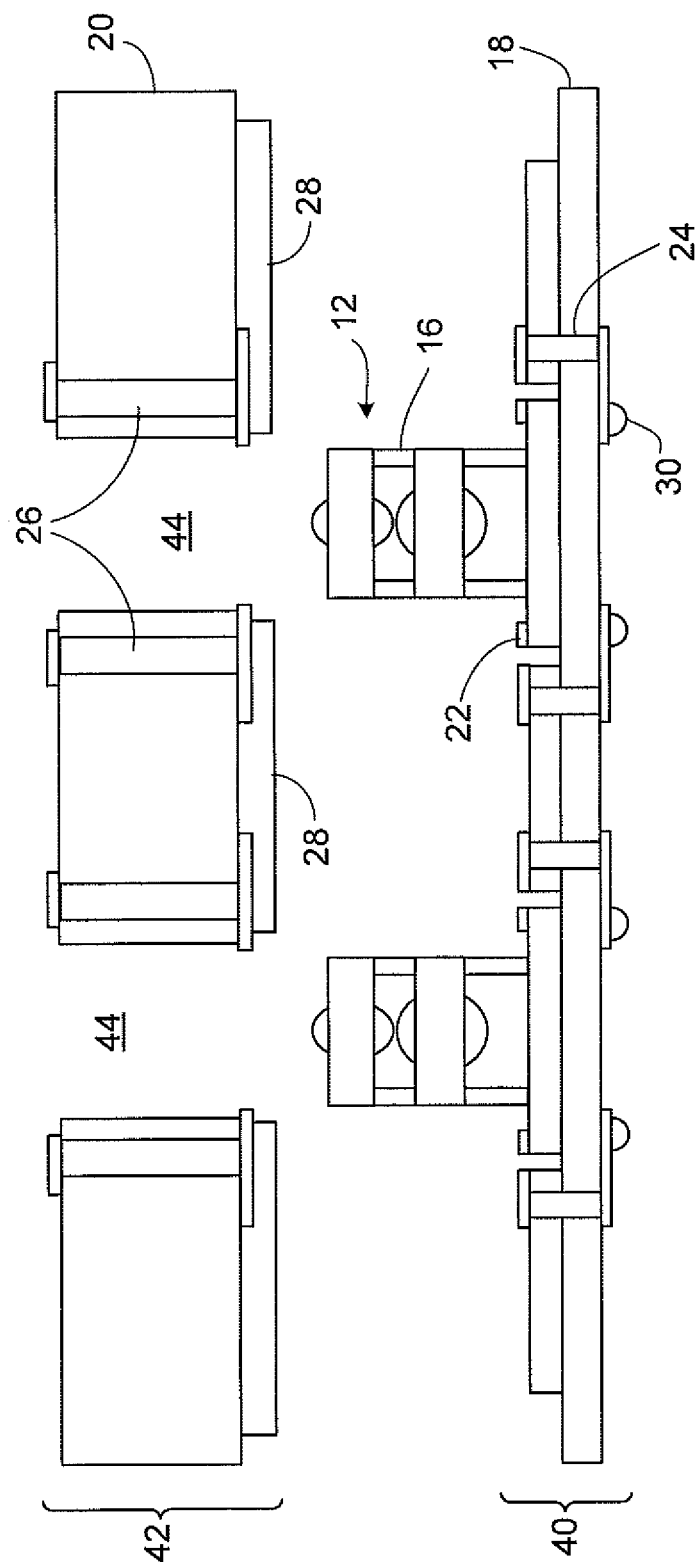
Figure 7:
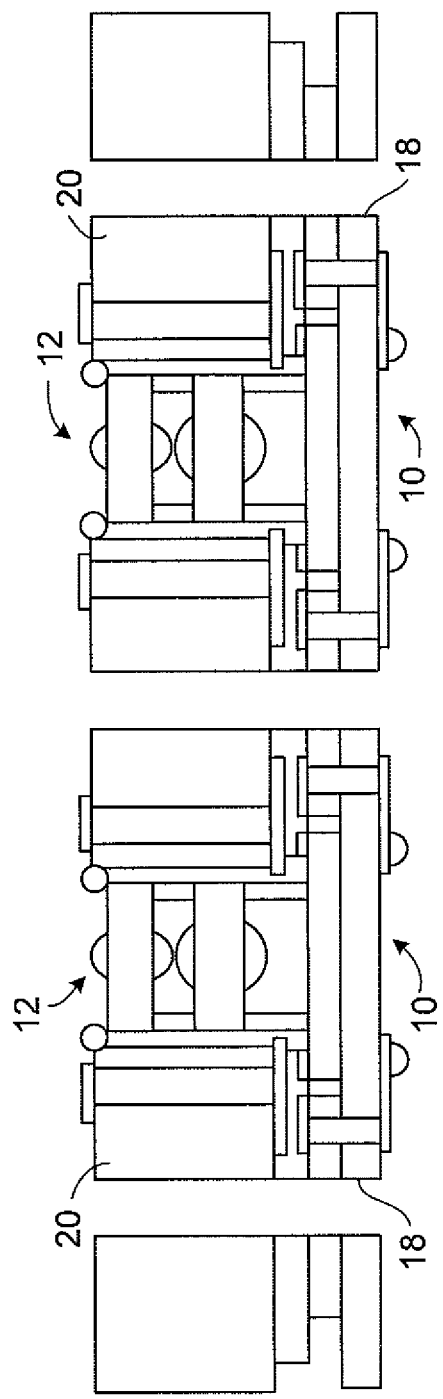

As illustrated in FIG. 4, a second substrate panel (e.g., a printed circuit board) 42, which includes wiring 26 and conductive connections 28, is provided and has openings (e.g., through-holes) 44 that correspond to positions for opto-electronic stacks 12. Second printed circuit board 42 is aligned with first printed circuit board 40 such that opto-electronic stacks 12 fit within openings 44 when the printed circuit boards are brought into contact. As shown in FIG. 5, the bottom surface of second printed circuit board 42 then is attached to the top surface of first printed circuit board 40 by way of conductive connections 28. This technique can result in conductive pads 22 being embedded between the top surface of first printed circuit board 40 by way of conductive connections 28. In some implementations, the space between the sides of opto-electronic stack 12 and the adjacent surface of housing walls 20 is coated with a metallic coating to provide protection from electromagnetic radiation. Next, as shown in FIG. 6, seals 32 are provided to close off the space between the sides of opto-electronic stack 12 and the adjacent surface of second printed circuit board 42. Printed circuit boards 40, 42 then are separated, for example, by dicing, into individual modules 10, as shown in FIG. 7.

The size of substrate panels (e.g., printed circuit boards 40, 42) can depend on the particular implementation. However, as an example, substrate panels 40, 42 can be 200 mm×300 mm panel, which can accommodate, for example, about 2000-2500 optical stacks of size of 5 mm×5 mm. Other dimensions may be appropriate for some implementations.

In the example of FIG. 1, opto-electronic stack 12 is illustrated as including lens stack 16 on opto-electronic element 14. However, other types of opto-electronic stacks or devices, as well as combinations of opto-electronic stacks and/or devices can be incorporated into a single module. Furthermore, such modules also can be fabricated in a wafer-level process similar to the process described above in FIGS. 2-7. Such other modules can include conductive pads 22 for each opto-electronic element, as well as wiring 24, 26 and conductive connections 28 for each opto-electronic stack and device in the module.

Figure 8:
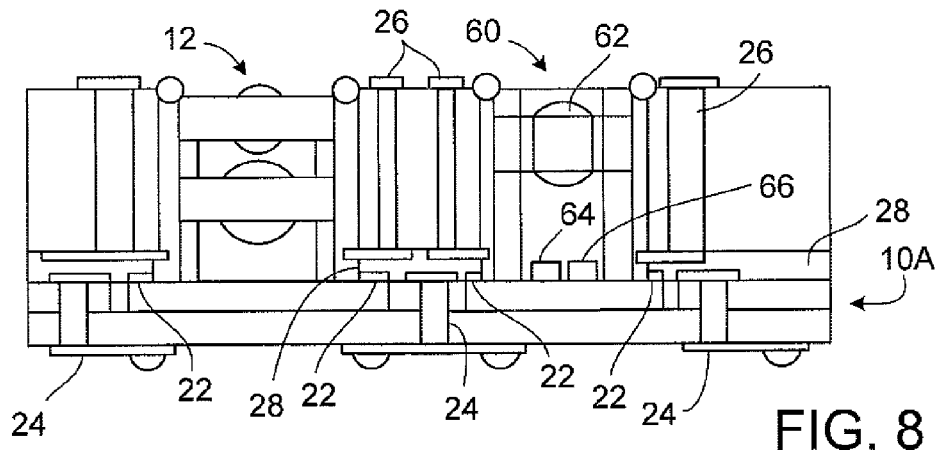
FIGS. 8 through 13 illustrate other examples of opto-electronic modules.

For example, FIG. 8 shows a module 10A that includes a camera-type opto-electronic stack 12 as described in connection with FIG. 1, and also includes an opto-electronic device 60 that has an optical element (e.g., a lens) 62, a light emitter (e.g., a LED) 64 and a light detector (e.g., a photodiode) 66. Like opto-electronic stack 12, second opto-electronic device 60 also can be pre-assembled using a wafer-level fabrication technique. Multiple pre-assembled opto-electronic stacks 12 and opto-electronic devices 60 then can be attached to a first printed circuit board. A second printed circuit board—similar to printed circuit board 42 described above—then can be provided and attached to the first printed circuit board.

Figure 9:
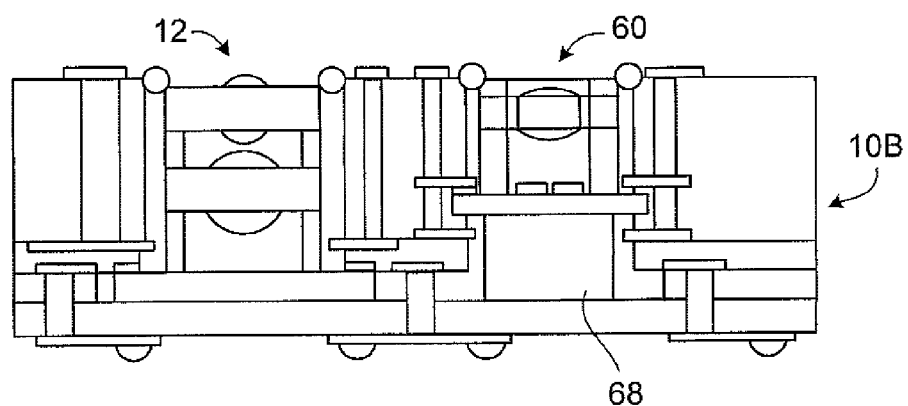

FIG. 9 illustrates another example of a module 10B that includes both a camera-type opto-electronic stack 12 and an opto-electronic device 60 similar to the one described above in connection with FIG. 8. Module 10B is similar to module 10A of FIG. 8. However, in the implementation of FIG. 9, opto-electronic device 60 is raised on a platform 68. Platform 68 can be provided, for example, by adding an additional layer on portions of the first printed circuit board before attaching pre-assembled opto-electronic stacks 12 and opto-electronic devices 60 to the first printed circuit board.

Figure 10:
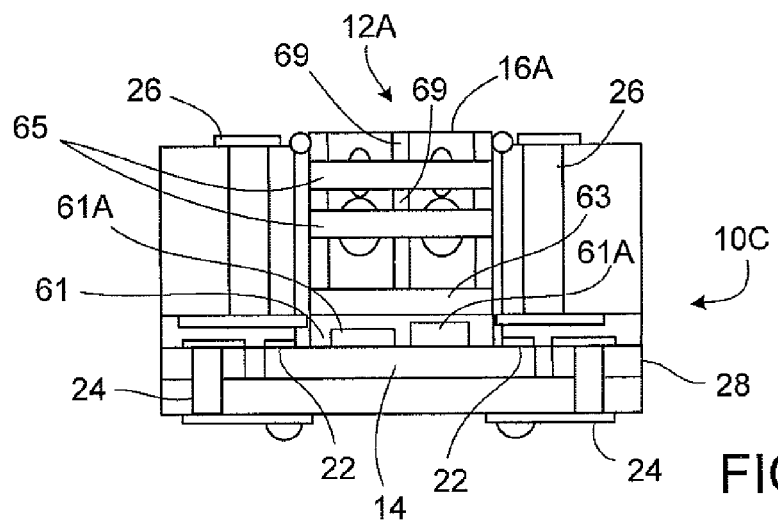

FIG. 10 illustrates yet another module 10C, which includes an array camera 12A as the opto-electronic stack. Array camera 12A includes opto-electronic element 14 and a lens stack 16A, in which pairs of lenses are separated by non-transparent walls 69. Array camera stack 12A includes spacers 61, 63 and 65, which can help correct focal length offsets of the lenses. Spacer 61 also includes machined holes 61A, which can assist in compensating for focus length offset.

Figure 11:
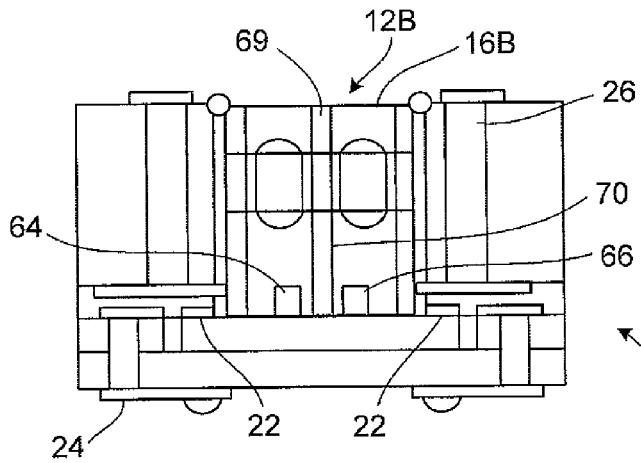

FIG. 11 illustrates another module 10D that includes an opto-electronic stack 12B for a sensor, including a light emitter (e.g., a LED) 64 and a light detector (e.g., a photodiode) 66. Each of the light emitter 64 and light detector 66 are aligned with respective lenses that form a lens stack 16B. In addition to non-transparent wall 69 that separates the respective lenses, light emitter 64 and light detector 66 also can separated by a wall 70 that is substantially to wavelengths of light emitted by emitter 64 and/or detected by detector 66.

Figure 12:
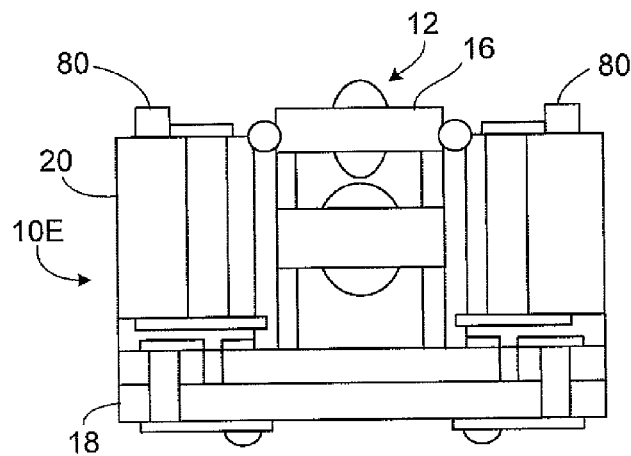
Figure 13:
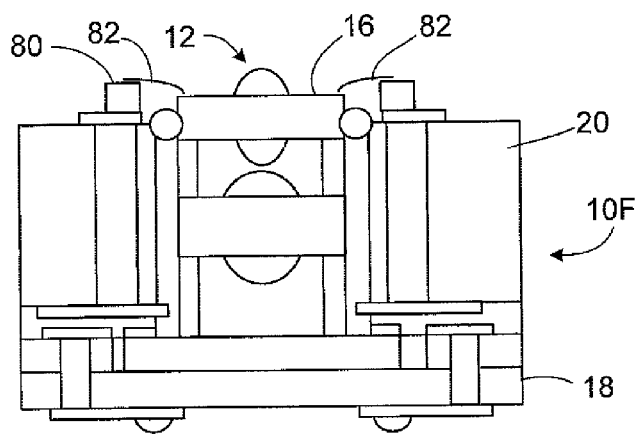
Figure 16:
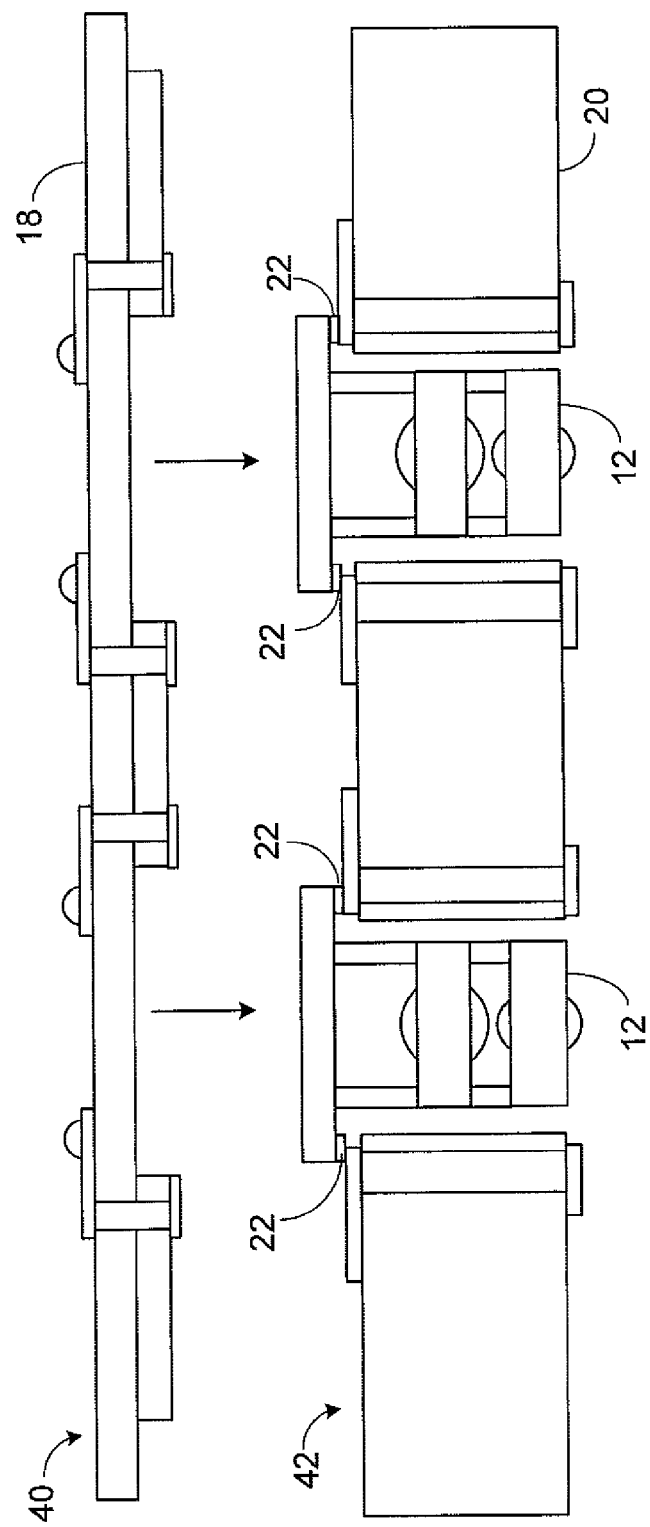
Figure 19:
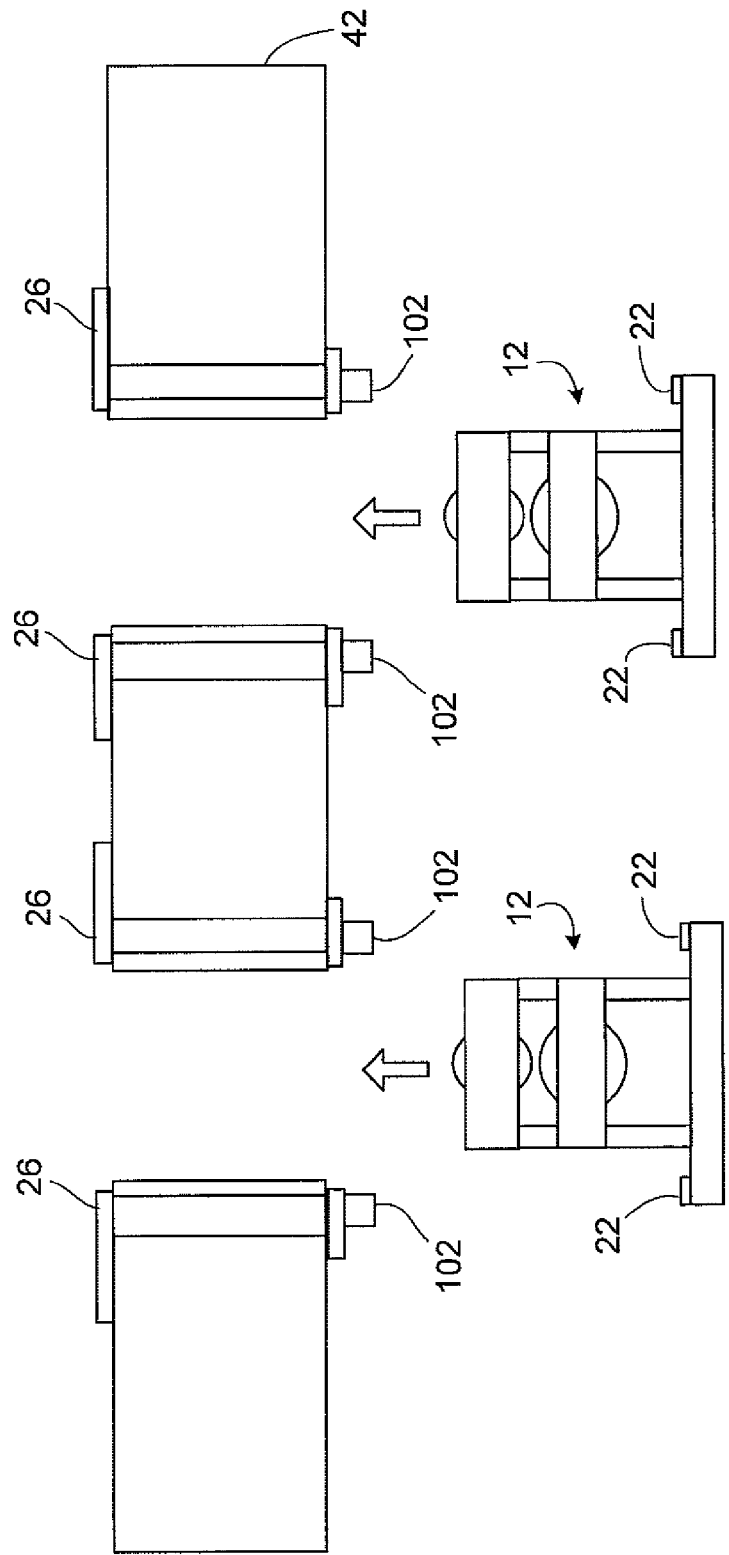
FIGS. 19 through 22 illustrate another top-down fabrication process for making multiple opto-electronic modules.
Figure 20:
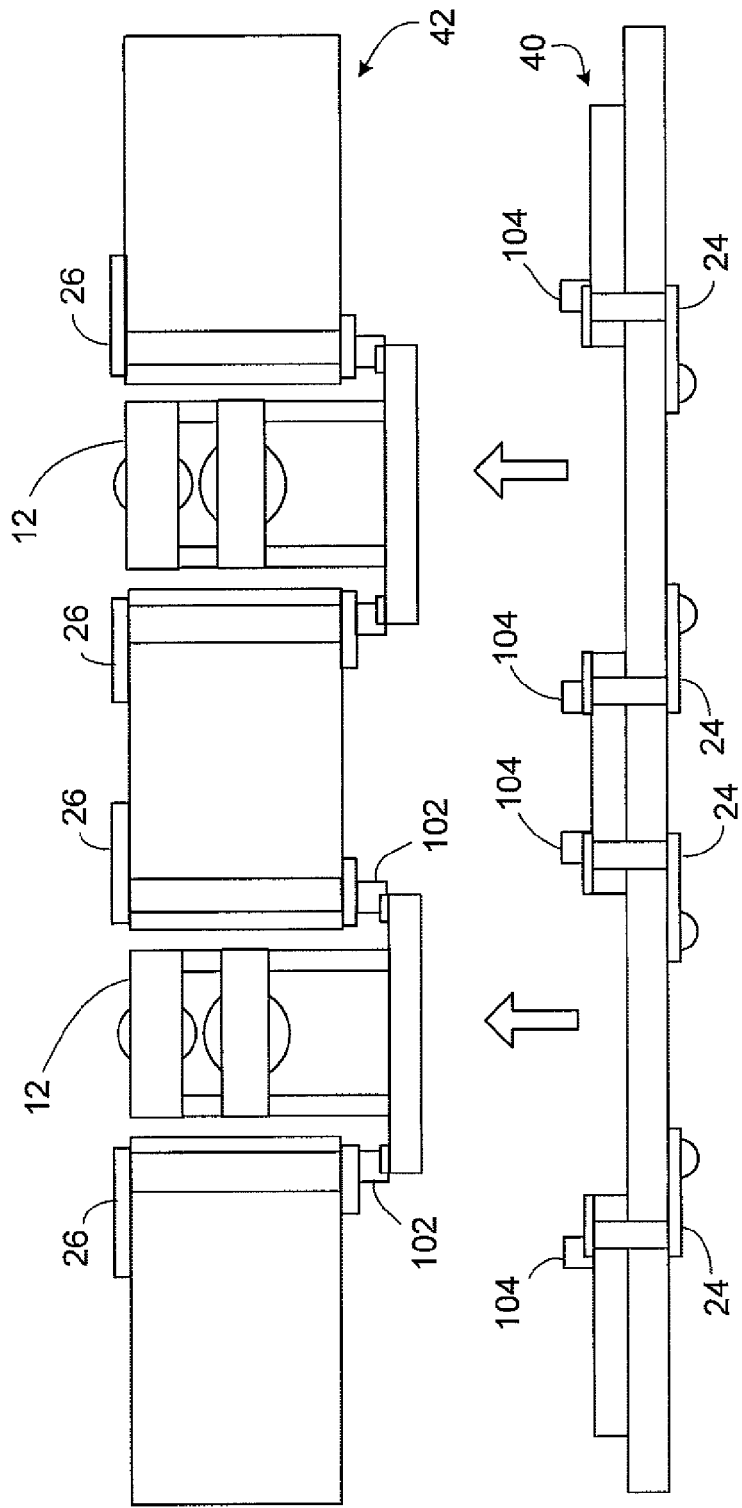
Figure 21:
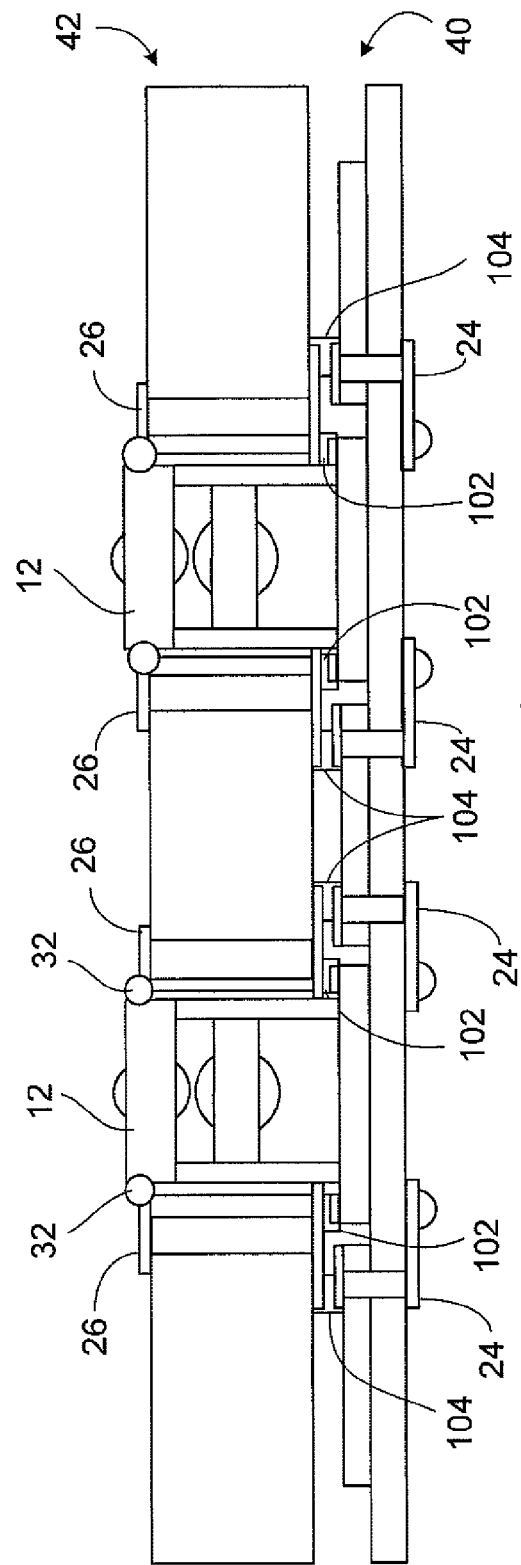
Figure 22:
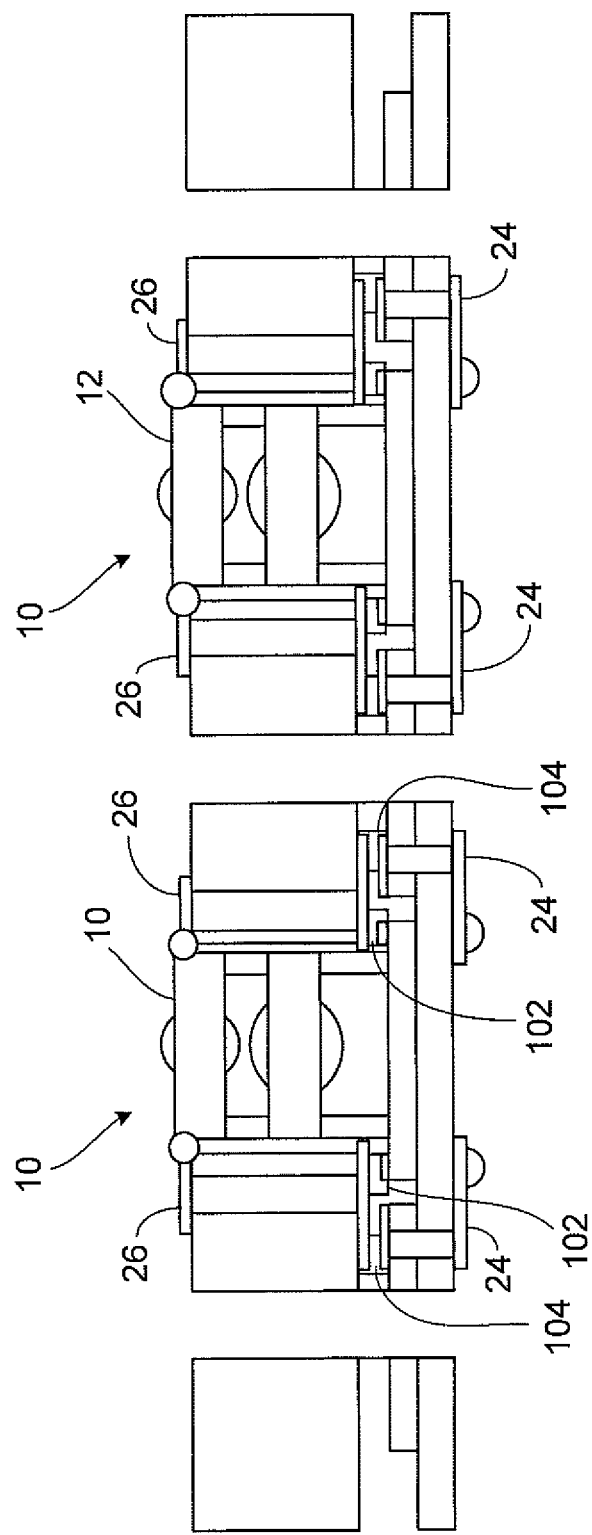

FIGS. 12 and 13 illustrate examples of modules 10E, 10F in which opt-electronic stack 12 and housing walls 20 are at different heights. In particular, lens stack 16 extends slightly higher than the top of housing walls 20. The lower height of housing walls 20 allows other components 80 (e.g., a decoupling capacitor, a low drop-out voltage regulator, a driver, a charge pump) or another module (e.g., a flash light or proximity sensor) to be provided on top of the module. Such other components or modules can be placed atop standoffs. In some implementations, additional component 80 is coupled electrically to lens stack 16 by a connection wire 82 to facilitate, for example, auto-focusing, image stabilization, or other functions associated with lens stack such as control of a lens, iris, or filter. Thus, wiring 26 in housing walls 20 can be used to facilitate enhanced functionality for the module. For example, in some implementations, wiring 26 can facilitate providing an autofocus function and can facilitate providing electro-mechanical actuators, power decoupling capacitors, resistors, coils, filters, driver circuitry for a sensor or for the optics, or similar electrical circuits assembled on a substrate using an embedded substrate manufacturing process or surface mounting technology (SMT).

As is apparent from the foregoing description, a wide range of opto-electronic stacks can be integrated into modules using a wafer-level fabrication process. The opto-electronic stacks can include flash-type lens stacks, array cameras, single lens cameras, proximity sensors, or other types of opto-electronic stacks.

The wafer-level fabrication process of FIGS. 2-7 is a bottom-up process (i.e., starting with first printed circuit board 40 that serves as the housing substrates 18). Other implementations, however, may use a top-down wafer-level process, which starts with second printed circuit board 42. As used in the present description, solder balls 30 are referred to as being at or near the "bottom" of the module, whereas seals 32 are referred to as being at or near the "top" of the module. Likewise, a surface of a particular component that is closer (in the vertical direction) to the bottom of the module may be referred to as a "bottom" surface, whereas a surface of a particular component that is closer (in the vertical direction) to the top of the module may be referred to as a "top" surface.

An example top-down wafer-level process is illustrated in FIGS. 14 through 18, in which opto-electronic stacks 12 are attached to second printed circuit board 42 (FIGS. 14-15), then first printed circuit board 40 is attached (FIGS. 16-17) and the then dicing is performed to separate the printed circuit board stack into individual modules 10 (FIG. 18). As described before, conductive connections 28 provide a conductive path between wiring 24 and 26. In addition, an adhesive material 100 (e.g., epoxy, glue, sticky tape) can be provided on one or both of the opposing surfaces of printed circuit boards 40, 42 (see FIG. 17) so as to help hold together printed circuit boards 40, 42 until the dicing. Likewise, an adhesive material 101 can be provided between the upper surface of first printed circuit board 40 and the lower surface of each opto-electronic elements 14 so as to hold together first printed circuit board 40 to opto-electronic stacks 12. Adhesive material 101 can be provided in a similar manner in other implementations as well.

Additional features can be provided in some implementations. For example, FIGS. 19 through 22 illustrate the use of anisotropic conductive films (ACFs) 102, 104 as conductive connections in two different types of locations. In particular, (i) ACF 102 is provided between the conductive contacts 22 on the upper surface of the of the opto-electrical element 14, and (ii) ACF 104 is provided between conductive vias 24 in first printed circuit board 40 and conductive vias 26 in second printed circuit board 42. In the illustrated implementation, second printed circuit board 42 can act as a redistribution layer. As there is more space between contact pads on printed circuit board 42, the process may not require the same tolerance precision as some other implementations. ACF 104 can be provided on either one or both of the printed circuit boards 40, 42 prior to their being attached to one another.

In order to reduce the amount of material required for the housing walls, some implementations use a thinner printed circuit board for second substrate panel 42 and a spacer 110 as shown in the process of FIGS. 23 through 25. In this example, as shown in FIG. 24, opto-electronic stack 12 is attached to a relatively thin second printed circuit board 42A (e.g., a printed circuit board whose height is significantly less than the height of opto-electronic stack 12). Then, first printed circuit board 40A is attached to second printed circuit board 42A adjacent opto-electronic element 14, as shown in FIG. 25. In addition, a spacer wafer 110 is attached to second printed circuit board 42A so as to surround the other end of opto-electronic stack 12. Following dicing of the stack into individual modules, the walls of spacer 110 are thinner than the thickness of housing walls 20 in the lateral direction. Spacer 110 can be composed, for example, of a material that is substantially non-transparent to wavelengths of light emitted by or detected by components in opto-electronic stack 12. Spacer 110 also can include at least partially embedded conductive vias to so that, as described previously, a conductive path extends from the bottom to the top of the module. The foregoing fabrication process can be performed at the wafer level so as to fabricate multiple modules simultaneously.

As described above, the foregoing implementations use two printed circuit boards that are attached to one another. To reduce the amount of printed circuit board material even further, opto-electronic modules can be fabricated using a single printed circuit board and a spacer. As example is illustrated in the sequence of FIGS. 26 and 27, in which opto-electronic stack 12 is attached to relatively thin printed circuit board 42A, and then a spacer wafer 110 is attached as described above. The surface of printed circuit board 42A opposite the surface where the spacer wafer 110 is attached includes conductive vias and solder balls for the ball grid array. Thus, after dicing, each module includes housing walls 20 and spacer 110, which surround lens stack 16. Opto-electronic element 14 is attached to lens stack 16. Conductive pads 22 on the surface of opto-electronic element 14 and conductive vias that extend through walls 20 and spacer 110 provide electrical connections from opto-electronic element 14 to solder balls 30 at the bottom of the module (shown at the top of FIG. 27) and to conductive contacts at the top of the of the module (shown at the bottom of FIG. 27). If a single printed circuit board that is as high as lens stack 12 is used instead of the combined printed circuit board 20 and spacer 110, then conductive vias also can extend from the bottom to the top of the printed circuit board. In some implementations, opto-electronic element 14 can be attached to the thin printed circuit board 42A and then the lens stack 16 and spacer 110 can be attached on the opposite side of the printed circuit board as shown in the sequence of FIGS. 28-30.

In the implementations of FIGS. 23-30, electrical contact also can be provided by conductive connections between the conductive vias and the conductive pads, similar to the conductive connections described with respect to other implementations.

Instead of printed circuit boards, other types of ceramic or fiberglass substrates can be used in some implementations.

Although some of the foregoing figures (e.g., FIGS. 2-7, 14-18, 19-22, 23-25, 26-27 and 28-30) illustrate a particular opto-electronic stack, any of the opto-electronic stacks described above can be used in combination with any of the fabrication techniques described above. Furthermore, other types of opto-electronic stacks that may differ in various details can be incorporated into the foregoing fabrication techniques.

Examples of devices into which the image sensor and other modules described above can be integrated include electronic devices such as camera phones, bio devices, mobile robots, surveillance cameras, camcorders, laptops, and tablet computers, as well as other devices.

Other implementations are within the scope of the claims.

What is claimed is:

1. An opto-electronic module comprising:
  an opto-electronic stack including at least one lens and an opto-electronic element, wherein the opto-electronic element has conductive pads on its surface;
  a housing including a substrate and walls, the walls laterally surrounding the at least one lens such that at least a portion of the at least one lens and the walls have an intersecting plane in common, the intersecting plane being parallel to the substrate
  wherein the substrate includes a first wiring, at least a portion of which is embedded within the substrate and which extends from a top surface of the substrate to a bottom surface of the substrate,
  wherein the walls include a second wiring, at least a portion of which is embedded within the walls and which extends from a bottom surface of the walls to a top surface of the walls, and
  wherein there is a hollow space between the at least one lens and the walls that include the second wiring;
  the module further including conductive connections disposed between a top surface of the substrate and the bottom surface of the walls, wherein the conductive connections electrically connect the second wiring to the first wiring and to the conductive pads on the surface of the opto-electronic element.

2. The opto-electronic module of claim 1 wherein the conductive connections comprise an anisotropic conductive material.

3. The opto-electronic module of claim 2 wherein the anisotropic conductive material comprises anisotropic conductive film, epoxy, paste or adhesive.

4. The opto-electronic module of claim 1 wherein the first and second wirings include plated through-holes, respectively, in the substrate and the walls.

5. The opto-electronic module of claim 1 wherein a portion of the first wiring is present on the bottom surface of the substrate, the module further including one or more solder balls on the portion of the first wiring that is on the bottom surface of the substrate.

6. The opto-electronic module of claim 1 wherein a portion of the second wiring is present on the top surface of the walls.

7. The opto-electronic module of claim 1 wherein the substrate and walls are composed of a printed circuit board material.

8. The opto-electronic module of claim 1 wherein the substrate and walls are composed of a ceramic or fiberglass material.

9. A method of fabricating opto-electronic modules, the method comprising:
  attaching a plurality of opto-electronic stacks to a first substrate, wherein each opto-electronic stack includes at least one lens and an opto-electronic element, and wherein at least a portion of each opto-electronic stack fits within a respective through-hole in the first substrate, wherein the opto-electronic element has conductive pads on its top surface, and wherein the first substrate includes first wirings, at least a portion of each first wiring being embedded within the first substrate and extending from a bottom surface of the first substrate to a top surface of the first substrate, wherein each of the conductive pads of the opto-electronic elements is connected to a portion of a respective one of the first wirings at the bottom surface of the first substrate;
  attaching a second substrate at the bottom surface of the first substrate, wherein the second substrate includes second wirings, at least a portion of each second wiring being embedded within the second substrate and extending from a bottom surface of the second substrate to a top surface of the second substrate, wherein a portion of each of the second wirings at the top surface of the second substrate is connected to a portion of a respective one of the first wirings at the bottom surface of the first substrate through a respective conductive connection; and
  separating the attached first and second substrates into a plurality of opto-electronic modules.

10. The method of claim 9 including providing an adhesive material to bond together the bottom surface of the first substrate with the top surface of the second substrate.

11. The method of claim 10 including providing an adhesive material to bond together the upper surface of the second substrate and a lower surface of the opto-electronic element in each opto-electronic stack.

12. The method of claim 9 wherein each conductive connection comprises an anisotropic conductive material.

13. The method of claim 12 wherein the anisotropic conductive material comprises anisotropic conductive film, epoxy, paste or adhesive.

14. The method of claim 9 wherein each conductive connection comprises an conductive elastomer strip.

15. The method of claim 9 wherein the first and second wirings include plated through-holes, respectively, in the first and second substrates.

16. The method of claim 9 wherein the first and second substrates are composed of a printed circuit board material.

17. The method of claim 9 wherein the first and second substrates are composed of a ceramic or fiberglass material.

18. A method of fabricating opto-electronic modules, the method comprising:
    attaching a plurality of opto-electronic stacks to a first printed circuit board, wherein each opto-electronic stack includes at least one lens and an opto-electronic element, and wherein at least a portion of each opto-electronic stack fits within a respective opening in the first printed circuit board, wherein the opto-electronic element has conductive pads on its top surface, and wherein the first printed circuit board includes first wirings, at least a portion of each first wiring being embedded within the first printed circuit board and extending from a bottom surface of the first printed circuit board to a top surface of the first printed circuit board, wherein each of the conductive pads of the opto-electronic elements is connected to a portion of a respective one of the first wirings at the bottom surface of the first printed circuit board by way of anisotropic conductive film material;
    attaching a second printed circuit board at the bottom surface of the first printed circuit board, wherein the second printed circuit board includes second wirings, at least a portion of each second wiring being embedded within the second printed circuit board and extending from a bottom surface of the second printed circuit board to a top surface of the second printed circuit board, wherein a portion of each of the second wirings at the top surface of the second printed circuit board is connected to a portion of a respective one of the first wirings at the bottom surface of the first printed circuit board by way of anisotropic conductive film material; and
    dicing the attached first and second printed circuit boards into a plurality of opto-electronic modules.

19. The method of claim 18 wherein the first and second wirings include plated through-holes, respectively, in the first and second printed circuit boards.

20. The method of claim 18 wherein each opto-electronic stack includes a lens stack, the method including inserting the lens stack into a respective one of the openings in the first printed circuit board so that an end of the lens stack is near the top surface of the first printed circuit board.

21. A method of fabricating opto-electronic modules, the method comprising:
    attaching a plurality of opto-electronic stacks to a first substrate, wherein each opto-electronic stack includes at least one lens and an opto-electronic element, wherein the first substrate includes first wirings, at least a portion of each first wiring being embedded within the first substrate and extending from a bottom surface of the first substrate to a top surface of the first substrate, wherein the opto-electronic element has conductive pads on its top surface; and
    attaching a second substrate at the top surface of the first substrate, wherein at least a portion of each opto-electronic stack fits within a respective through-hole in the second substrate, wherein the second substrate includes second wirings, at least a portion of each second wiring being embedded within the second substrate and extending from a bottom surface of the second substrate to a top surface of the second substrate, wherein each of the conductive pads of the opto-electronic elements is connected to a portion of a respective one of the second wirings at the bottom surface of the second substrate, and wherein a portion of each of the first wirings at the top surface of the first substrate is connected to a portion of a respective one of the second wirings at the bottom surface of the second substrate through a respective conductive connection; and
    dicing the attached first and second substrates into a plurality of opto-electronic modules.

22. The method of claim 21 wherein the conductive connections comprise an anisotropic conductive material.

23. The method of claim 22 wherein the anisotropic conductive material comprises anisotropic conductive film, epoxy, paste or adhesive.

24. The method of claim 21 wherein the first and second wirings include plated through-holes, respectively, in the first and second substrates.

25. The method of claim 21 wherein the first and second substrates are composed of a ceramic or fiberglass material.

26. The method of claim 21 wherein the opto-electronic stack comprises a lens array having a least one lens aligned with respect to a photodiode and having at least one lens aligned with respect to a light emitting diode.

27. The method of claim 21 wherein the opto-electronic stack includes a lens stack that extends above the top surface of the second substrate, the method including:
    electrically coupling an electronic device to the lens stack for controlling a function of the lens stack, wherein the electronic device is disposed over the top surface of the second substrate and is electrically coupled to the second wiring at the top surface of the second substrate.

28. The method of claim 21 wherein the opto-electronic stack includes an array camera.

29. The opto-electronic module of claim 1 wherein the opto-electronic stack is disposed on a top surface of the housing substrate.

30. The opto-electronic module of claim 1 wherein the opto-electronic stack includes a lens stack comprising a plurality of lenses stacked one above the other.

* * * * *